United States Patent [19]
Jennings et al.

[11] Patent Number: 5,376,518
[45] Date of Patent: Dec. 27, 1994

[54] PHOTOGRAPHIC ELEMENT PROVIDED WITH A BACKING LAYER AND METHOD FOR MANUFACTURE THEREOF

[75] Inventors: David F. Jennings; Charles C. Anderson, both of Penfield; Benneth C. Onuh, Rochester; Mario D. DeLaura, Hamlin, all of N.Y.

[73] Assignee: Eastman Kodak Company, Rochester, N.Y.

[21] Appl. No.: 245,402

[22] Filed: May 18, 1994

Related U.S. Application Data

[62] Division of Ser. No. 125,880, Sep. 23, 1993.

[51] Int. Cl.$^5$ ............................................. G03C 1/76
[52] U.S. Cl. .................................. 430/535; 430/523; 430/531; 430/533; 430/534
[58] Field of Search ............... 430/523, 533, 534, 535, 430/531

[56] References Cited

U.S. PATENT DOCUMENTS 2,870,013  1/1959  Jeffreys .
3,819,608  6/1974  Yamamoto et al. .
4,977,065  12/1990  Westfal et al. .
4,997,735  5/1991  Nitschke et al. .
5,077,185  10/1991  Cho et al. .

FOREIGN PATENT DOCUMENTS 0514903  11/1992  European Pat. Off. .

*Primary Examiner*—Jack R. Brammer
*Attorney, Agent, or Firm*—Alfred P. Lorenzo

[57] ABSTRACT

A photographic element that is useful as an imaging master in the field of graphic arts is comprised of a dimensionally-stable polyester film having a radiation-sensitive silver halide emulsion layer on one side thereof and having on the opposite side, in order, a latex subbing layer and a backing layer. The backing layer is comprised of gelatin, a matting agent, a filter dye and a blocked gelatin-hardening agent. In the manufacture of the photographic element, a high temperature heating step is employed to activate the blocked gelatin-hardening agent and thereby harden the backing layer.

16 Claims, No Drawings

PHOTOGRAPHIC ELEMENT PROVIDED WITH A BACKING LAYER AND METHOD FOR MANUFACTURE THEREOF

This is a division of application Ser. No. U.S. 125,880, filed Sept. 23, 1993, now pending.

FIELD OF THE INVENTION

This invention relates in general to photography and in particular to a novel photographic element useful as an imaging master in the field of graphic arts. More specifically, this invention relates to a dimensionally-stable photographic element comprising a support having a radiation-sensitive silver halide emulsion layer on one side thereof and a backing layer on the opposite side, and to a method for manufacture of such photographic element.

BACKGROUND OF THE INVENTION

In the field of graphic arts, it is well known to utilize as an imaging master a silver halide photographic element comprising a dimensionally-stable polyester film support. Polyester films are utilized in such elements because their dimensional stability characteristics are unsurpassed. However, because of the difficulty of achieving strong bonding of overlying hydrophilic colloid layers to such films, it is usually necessary to employ a latex subbing layer between a polyester film support and the overlying photographic layer, such as a silver halide emulsion layer or a backing layer. Latex subbing layers used to promote the adhesion of coating compositions to polyester film supports are very well known in the photographic art. Useful compositions for this purpose include interpolymers of vinylidene chloride such as vinylidene chloride/acrylonitrile/acrylic acid terpolymers or vinylidene chloride/methyl acrylate/itaconic acid terpolymers. Such compositions are described in numerous patents such as, for example, U.S. Pat. Nos. 2,627,088, 2,698,235, 2,698,240, 2,943,937, 3,143,421, 3,201,249, 3,271,178, 3,443,950 and 3,501,301. The latex subbing layer is typically overcoated with a second subbing layer comprised of gelatin which is typically referred to in the art as a "gel sub." Functional layers, such as silver halide emulsion layers containing gelatin or other hydrophilic colloid as a binder, are then applied over the gel sub layer.

Since photographic elements employed as imaging masters in the field of graphic arts typically have functional layers on both sides thereof, the polyester films used as supports are commonly provided on both sides with both a latex subbing layer and a gel sub layer. Thus, a typical photographic element of this type has a latex subbing layer, a gel sub layer and a silver halide emulsion layer on one side and has a latex subbing layer, a gel sub layer and a backing layer on the opposite side.

In photographic elements comprising a silver halide emulsion layer on one side and a backing layer on the opposite side, the backing layer has to fulfill many requirements and meeting all of these requirements simultaneously has proven to be extraordinarily difficult. Exemplary of the essential requirements for a backing layer adapted for use in a graphic arts imaging master are the following:

(1) The backing layer must function to prevent excessive curl. This is typically done by designing the backing layer to balance the expansion and contraction forces in the layers on the opposite side of the film support. When forces on both sides of the film support are equal, curl is essentially eliminated. However, a serious problem exists in using this technique in that providing such a backing layer adds to the forces which cause the photographic element to expand and contract with changes in humidity, thereby degrading dimensional stability.

(2) The backing layer must function to provide effective halation protection without leaving residual dye stain. Incorporating filter dyes in the backing layer can serve to provide protection against image degradation through light reflecting from the base to the air interface, a phenomenon known as "halation." When the photographic element is of the type which is handled in roomlight or under bright safelights, the filter dyes in the backing also act to prevent unwanted exposure. It is critically important that such dyes are removed in the processing steps so that there is no residual dye stain after processing. This requirement severely limits the choice of binders that can be used in the backing layer, since a backing layer with poor water-permeability characteristics will inhibit the dissolution and removal of the dyes during processing.

(3) The backing layer must function to absorb water-based inks used to correct image defects in a process known in the graphic arts as "opaquing." In certain graphic arts operations, the need to guarantee against image defects is very high. An example would be where the photographic element is used to create an etched image on a gravure printing cylinder. Under these conditions, correcting an image defect in the printing cylinder is most difficult and costly. The user will tend to liberal use of opaquing ink and the preferred surface for opaquing is the back side of the element since if it becomes necessary to remove the opaque, the image will not be damaged. Thus, it is highly desirable that a backing layer be receptive to water-based inks.

(4) The backing layer must function to promote effective vacuum contacting in a vacuum drawdown process. As described in Nitschke et al, U.S. Pat. No. 4,997,735, issued Mar. 5, 1991, silver halide photographic elements utilized as imaging masters in the graphic arts are commonly employed in contact exposure processes which involve juxtaposing two photographic elements and drawing a vacuum between them, usually in a device known in the art as a vacuum frame. To promote effective vacuum contacting, the backing layer of the imaging master must have an appropriate surface roughness and this is usually achieved by incorporating matting agents in the backing layer. As pointed out in the '735 patent, the use of a high concentration of gelatin as the binder in the backing layer makes it difficult to achieve the desired vacuum drawdown efficiency. To achieve such efficiency, the '735 patent makes use of a low level of binder. It also advocates the use of hydrophobic polymeric binders such as polyurethanes, cellulose acetates and poly(methylmethacrylate) in an element which has no gelatin layers on the backing layer side of the support. While this provides for very efficient vacuum drawdown, it has the disadvantage of poor opaquing performance since aqueous-based opaquing inks used in the graphic arts do not wet or adhere well to such hydrophobic backings. Moreover, such backing layers have only very limited water permeability and this severely inhibits the dissolution and removal of filter dyes during processing. The problem is an especially acute one in the field of graphic arts where very brief processing times are utilized to increase productivity.

(5) The backing layer must function to effectively resist aqueous alkaline developing solutions used in the processing of the photographic element. Thus, the backing layer must not dissolve in the developing solution or in other processing solutions. Moreover, the backing layer must be sufficiently hard that it resists softening and becoming tacky when the photographic element is processed. A soft and tacky surface is highly undesirable because of dirt pickup that occurs in processing machines. Thus, for example, foreign matter can be readily transferred from the rollers of the processing machine if the surface is soft and tacky. To avoid such problems, the backing layer should be applied and fully hardened during the manufacturing process.

In the manufacturing process, it is highly advantageous for the backing layer to be applied in a coating step that takes place prior to the coating of the silver halide emulsion layer. By this means, any waste, e.g., product that does not meet specification or has some unacceptable defect, associated with the coating application of the backing layer is at the cost of film support rather than at the cost of silver halide photographic emulsion coated product. This represents a significant cost saving. It is also important that the backing layer achieve its final properties quickly, without the need for any prolonged hardening or curing process. In this way, the physical properties of the backing layer can be tested before application of the costly silver halide emulsion layer and without any time delay or need for inventory control to allow for prolonged hardening or curing.

U.S. Pat. No. 4,977,065 describes a process for the production of a waterproof support material with an anticurl backing layer applied in two successive coating steps. The bottom layer comprises gelatin and a chromium (III) salt hardener, while the upper layer, that is applied after fully drying the bottom layer, comprises a chromium (III) salt-hardened non-gelatin layer. Glyoxal can also be added as an additional hardener. Reportedly, the process provides a curl control backing with extremely low water absorption. However, a backing layer with extremely low water absorption is not desirable for thorough dissolution of antihalation dyes nor for the application, drying, and adherence of water-based opaquing inks.

U.S. Pat. No. 5,077,185 describes a backing layer for graphic arts photographic elements that comprises a water-soluble electrically-conductive polymer having functionally attached carboxyl groups, a polyfunctional aziridine crosslinking agent, an antihalation dye and matte beads. Reportedly the layer provides antistatic and antihalation properties as well as low dye stain and improved dimensional stability. The layer was not reported to provide curl control.

European Patent Application No. 514,903, published Nov. 25, 1992, describes a backing layer that is reportedly useful for graphic arts photographic elements which comprises a bottom layer that is primarily gelatin and a top layer which comprises an acrylate polymer latex as the binder. However, for good opaquing and good dye dissolution, utilization of such a hydrophobic top layer is undesirable.

It is toward the objective of providing a novel photographic element, useful as an imaging master in the graphic arts that overcomes the disadvantages and limitations of the prior art, that this invention is directed. It is also an objective of the invention to provide a new and improved process for the manufacture of such photographic elements.

SUMMARY OF THE INVENTION

In accordance with this invention, a photographic element that is useful as an imaging master in the field of graphic arts is comprised of a dimensionally-stable polyester film having a radiation-sensitive silver halide emulsion layer on one side thereof and having on the opposite side, in order, a latex subbing layer directly overlying the polyester film and a backing layer directly overlying the latex subbing layer, the backing layer comprising:

(a) gelatin in an amount of at least 300 mg/m$^2$,
(b) a matting agent,
(c) a filter dye, and
(d) a blocked gelatin-hardening agent.

The backing layer of this invention serves to:

(1) prevent curl;
(2) provide halation protection;
(3) promote effective vacuum contacting in a vacuum drawdown process;
(4) absorb water-based ink used for correction of image defects; and
(5) resist aqueous alkaline developing solutions used in processing of the photographic element, By the term "blocked gelatin-hardening agent" as used herein is meant a hardening agent that releases an active hardening species upon heating. Such hardening agents are well known in the photographic art.

The backing layer of this invention utilizes a substantial concentration of gelatin, i.e., at least 300 mg/m$^2$ to provide good curl control, to facilitate absorption of water-based opaquing inks and to promote dissolution and removal of filter dyes. It employs a matting agent to promote effective vacuum contacting and a filter dye to provide halation protection. Most importantly, it employs a blocked gelatin-hardening agent to provide effective and rapid hardening of the gelatin during manufacture of the photographic element and to provide a hardened layer that effectively resists aqueous alkaline processing solutions and that is non-tacky so as to avoid dirt pickup problems.

The backing layer of this invention can consist of a single stratum or of more than one stratum. For example, the backing layer can consist of upper and lower strata, with the lower stratum comprising gelatin, a filter dye, and a blocked gelatin-hardening agent and the upper stratum comprising gelatin, a matting agent, and a blocked gelatin-hardening agent. This arrangement has the advantage that the filter dye is less likely to diffuse to the surface since the upper stratum acts as a barrier to diffusion of the dye and the further advantage that the matting agent is present in the upper portion of the backing layer where it is most effective. Another suitable arrangement is to have an upper stratum and a lower stratum which are of identical composition but are coated separately in order to facilitate the coating operation. Whether such separation into multiple strata is needed depends primarily on the type of coating equipment employed. Thus, for example, with the use of gravure coating techniques all of the necessary components of the backing layer can be readily coated in the form of a single stratum that provides the necessary level of dry coverage.

It is an important feature of the present invention that the backing layer directly overlies the latex subbing layer. Thus, on the side of the support which is to receive the backing layer, the polyester film is provided with a conventional latex subbing layer, as hereinabove described, but the conventional gel sub layer is not needed and is omitted. This simplifies the construction of the element as compared to prior art elements comprising a latex subbing layer, a gel sub layer overlying the latex subbing layer and a backing layer overlying the gel sub layer. In the photographic element of this invention, the side of the support which is to receive the silver halide emulsion layer will typically be provided with both a latex subbing layer and a gel sub layer.

The invention also provides a novel method for the manufacture of a photographic element that is useful as an imaging master in the field of graphic arts, the photographic element comprising a dimensionally-stable support having on one side thereof a radiation-sensitive silver halide emulsion layer and on the opposite side thereof a backing layer. The novel manufacturing method comprises the steps of:

(a) providing a dimensionally-stable polyester film having on one side thereof a latex subbing layer;
(b) forming a backing layer which directly overlies the latex subbing layer, the backing layer comprising:
 (1) gelatin in an amount of at least 300 mg/m$^2$;
 (2) a matting agent,
 (3) a filter dye, and
 (4) a blocked gelatin-hardening agent;
(c) heating the photographic element at a temperature and for a time sufficient to:
 (1) dry the backing layer,
 (2) activate the blocked gelatin-hardening agent and thereby harden the backing layer,
 (3) heat relax the polyester film, and
 (4) promote adhesion of the backing layer to the latex subbing layer; and
(d) applying a radiation-sensitive silver halide emulsion layer to the opposite side of the polyester film.

A key feature of the novel manufacturing process of this invention is the heating step. Since the backing layer is coated before the silver halide emulsion layer is coated, the photographic element can be heated to relatively high temperatures, e.g., greater than 100° C., which a silver halide emulsion layer could not withstand. The high temperature heating not only rapidly dries the backing layer but also activates the blocked gelatin-hardening agent and drives the hardening reactions to completion during the short period of time that this step requires. The high temperature heating is also very important to strongly bond the backing layer to the latex subbing layer and thereby avoid the risk of delamination occurring. Sufficient heat can be supplied for a sufficient time to heat relax the polyester film and thereby promote desired dimensional stability. Because the high temperature heating step promotes bonding of the backing layer to the latex subbing layer, the use of an intervening gel sub layer is unnecessary and this provides significant cost saving.

The novel manufacturing process of this invention is especially beneficial in that application of the backing layer is carried out as part of the film base manufacturing operation. Thus, in subsequent sensitizing operations it is only necessary to coat one side of the film base. This greatly simplifies the sensitizing operations as contrasted with prior art procedures in which application of both radiation-sensitive emulsion layers and backing layers has been conducted in the sensitizing operation.

DETAILED DESCRIPTION OF THE INVENTION

Polyester films, such as films of poly(ethylene terephthalate) or poly(ethylene naphthalate), have many advantageous properties, such as excellent strength and dimensional stability, which render them especially advantageous for use as supports in the present invention.

The polyester film supports which can be advantageously employed in this invention are well known and widely used materials. Such film supports are typically prepared from high molecular weight polyesters derived by condensing a dihydric alcohol with a dibasic saturated fatty carboxylic acid or derivative thereof. Suitable dihydric alcohols for use in preparing polyesters are well known in the art and include any glycol, wherein the hydroxyl groups are on the terminal carbon atom and that contains from 2 to 12 carbon atoms such as, for example, ethylene glycol, propylene glycol, trimethylene glycol, hexamethylene glycol, decamethylene glycol, dodecamethylene glycol, and 1,4-cyclohexane dimethanol. Dibasic acids that can be employed in preparing polyesters are well known in the art and include those dibasic acids containing from 1 to 16 carbon atoms. Specific examples of suitable dibasic acids include adipic acid, sebacic acid, isophthalic acid, and terephthalic acid. The alkyl esters of the above-enumerated acids can also be employed satisfactorily.

Specific preferred examples of polyester resins which, in the form of sheeting, can be used in this invention are poly(ethylene terephthalate), poly(cyclohexane 1,4-dimethylene terephthalate), and poly(ethylene naphthalate).

The thickness of the polyester film employed in carrying out this invention is not critical. For example, polyester film of a thickness of from about 0.05 to about 0.25 millimeters can be employed with satisfactory results.

In a typical process for the manufacture of a polyester photographic film support, the polyester is melt extruded through a slit die, quenched to the amorphous state, oriented by transverse and longitudinal stretching, and heat set under dimensional restraint. In addition to being directionally oriented and heat set, the polyester film can also be subjected to a subsequent heat relax treatment to provide still further improvement in dimensional stability and surface smoothness.

In this invention, it is essential that the polyester film be provided with a latex subbing layer on the side on which the backing layer is to be coated. The subbing layer ensures firm bonding of the backing layer to the support.

As indicated hereinabove, latex subbing layers are well known and widely used in the photographic art. A preferred class of latex polymers for the purposes of this invention are vinylidene chloride-containing polymers having carboxyl functional groups. Illustrative of such polymers are (1) copolymers of vinylidene chloride and an unsaturated carboxylic acid such as acrylic or methacrylic acid, (2) copolymers of vinylidene chloride and a half ester of an unsaturated carboxylic acid such as the mono methyl ester of itaconic acid, (3) terpolymers of vinylidene chloride, itaconic acid and an alkyl acrylate or methacrylate such as ethyl acrylate or methyl methacrylate, and (4) terpolymers of vinylidene chloride, acrylonitrile or methacrylonitrile and an unsaturated carboxylic acid such as acrylic acid or methacrylic acid. Preferred polymers of this type are those containing at least 50 mole % and more preferably at least 70 mole % of vinylidene chloride. An especially preferred vinylidene-chloride-containing polymer having carboxyl functional groups is a terpolymer of 70 to 90 mole % vinylidene chloride, 5 to 25 mole % methyl acrylate, and 1 to 10 mole % itaconic acid.

The latex subbing layer is typically a very thin layer, for example, a dry coverage of from about 10 to about 100 mg/m$^2$.

In this invention, the backing layer directly overlies the latex subbing layer, i.e., there is no need for an intervening gel sub layer. It is essential that the backing layer of this invention contain gelatin as the binder. As explained hereinabove, hydrophobic binders will not meet the requirements for an effective backing layer for a photographic element that is useful as an imaging master in the graphic arts. Alkali-treated gelatin (cattle bone or hide gelatin), acid-treated gelatin (pigskin gelatin) and gelatin derivatives such as acetylated gelatin or phthalated gelatin can be usefully employed.

Gelatin is incorporated in the backing layer of this invention in an amount sufficient to provide a dry coverage of at least 300 mg/m$^2$, more preferably in an amount of from about 400 to about 3000 mg/m$^2$ and most preferably in an amount of from about 500 to about 1500 mg/m$^2$. An amount of gelatin of less than 300 mg/m$^2$ does not provide adequate protection against curl. On the other hand, an excessively thick gelatin backing layer will degrade dimensional stability.

In addition to gelatin, the backing layer comprises a matting agent, a filter dye and a blocked gelatin-hardening agent. The amounts in which these ingredients are employed is not critical. Typically, the matting agent is employed in an amount of from about 2 to about 30 mg/m$^2$, the filter dye is employed in an amount of from about 10 to about 200 mg/m$^2$, and the blocked gelatin-hardening agent is employed in an amount of from about 0.5 to about 10 percent, preferably 1 to 5 percent, of the weight of the gelatin.

Matting agents are very commonly used in photographic elements and a wide variety of such agents are known to the photographic art. Matting agents can provide an irregular surface to a photographic element, thereby permitting sufficient surface roughness to allow retouching or writing on the surface of the element. Surface roughness can also be desirable to prevent the surface of the photographic material from sticking to an adjacent surface and can provide a desired coefficient of friction to allow for use in apparatus for rapid handling and transport of the photographic material. Additionally, matting agents can help prevent the formation of Newton's rings when printing and enlarging because the area of contact of the surface of the photographic material with another material is relatively small due to the spacing effect of the matting agent. In lithographic photographic processes involving juxtaposing an unexposed photographic element with an original image that is desired to be copied, or an image-containing processed film element with a printing plate to impose an image on the plate, roughness on the surface of the film element imparted by a matting agent allows for relatively rapid vacuum drawdown between the film element and the original or plate.

Either organic or inorganic matting agents can be used in the backing layer of this invention. A suitable average particle diameter is in the range of from about 0.5 to about 10 micrometers. Examples of organic matting agents are particles, often in the form of beads, of polymers such as polymeric esters of acrylic and methacrylic acid, e.g., poly(methylmethacrylate), cellulose esters such as cellulose acetate propionate, cellulose ethers, ethyl cellulose, polyvinyl resins such as poly(vinyl acetate), styrene polymers and copolymers, and the like. Examples of inorganic matting agents are particles of glass, silicon dioxide, titanium dioxide magnesium oxide, aluminum oxide, barium sulfate, calcium carbonate, and the like. Matting agents and the way they are used are further described in U.S. Pat. Nos. 3,411,907 and 3,754,924.

The use of filter dyes in photographic elements is very well known. These dyes can be used to provide protection against halation and/or to minimize unwanted exposure. Useful filter dyes include oxonols, cyanines, merocyanines, arylidenes, and the like.

The filter dyes used in this invention can be diffusible or non-diffusible but should be solubilizable during photographic processing to avoid residual dye stain. Diffusible dyes are preferably incorporated in the photographic element with a mordant to prevent dye wandering prior to photographic processing. Useful dyes include the pyrazolone oxonol dyes of U.S. Pat. No. 2,274,782, the solubilized diaryl azo dyes of U.S. Pat. No. 2,956,879, the solubilized styryl and butadienyl dyes of U.S. Pat. Nos. 3,423,207 and 3,384,487, the merocyanine dyes of U.S. Pat. No. 2,527,583, the merocyanine and oxonol dyes of U.S. Pat. Nos. 3,486,897, 3,652,284, and 3,718,472, the enamino hemioxonol dyes of U.S. Pat. No. 3,976,661, as well as ultraviolet absorbers, such as the cyanomethyl sulfone-derived merocyanines of U.S. Pat. No. 3,723,154, the thiazolidones, benzotriazoles, and thiazolothiazoles of U.S. Pat. Nos. 2,739,888, 3,253,921, 3,250,617, and 2,739,971, the triazotes of U.S. Pat. No. 3,004,896, and the hemioxonols of U.S. Pat. Nos. 3,215,597, and 4,045,229. Useful mordants are described, for example, in U.S. Pat. Nos. 3,282,699, 3,455,693, 3,438,779, and 3,795,519.

In a particular embodiment of this invention, the filter dyes are solid particle dispersion filter dyes, as described in U.S. Pat. No. 4,092,168 and PCT Application Publication No. WO88/04794, the disclosures of which are incorporated herein by reference. Such dyes can be described by the formula:

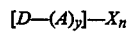

where D is a chromophoric light-absorbing moiety, which may or may not comprise an aromatic ring if y is not 0 and which comprises an aromatic ring if y is 0, A is an aromatic ring bonded directly or indirectly to D, X is a substituent, either on A or on an aromatic ring portion of D, with an ionizable proton, y is 0 to 4, and n is 1 to 7, where the dye is substantially aqueous soluble at a pH of 8 or above. In dyes according to the above formula, X preferably has a pKa of 4 to 11 in a 50/50 volume basis mixture of ethanol and water. The dyes according to the above formula also preferably have a log partition coefficient (log P) of from 0 to 6 when X is in unionized form.

Preferred soluble filter dyes for use in this invention include the following (in each instance, M represents a cation):

Dye D1

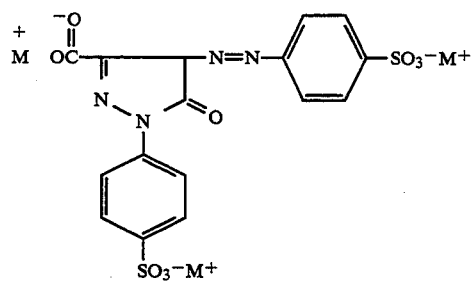

Dye D2

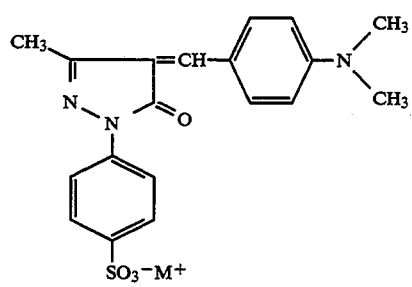

Dye D3

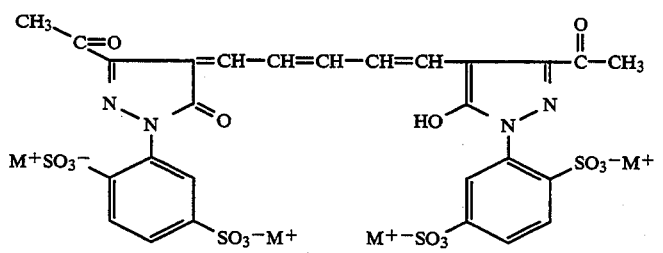

Dye D4

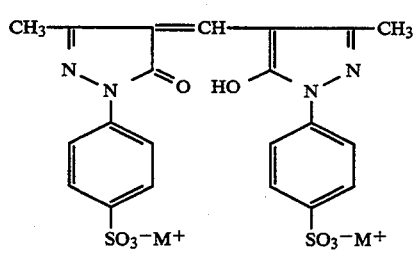

Dye D5

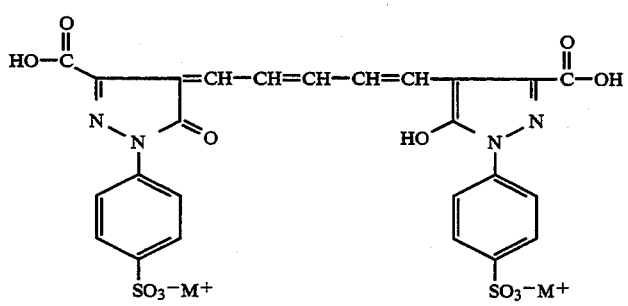

Gelatin-hardening agents and their use in photographic elements are described in T. H. James, "The Theory Of The Photographic Process", 4th Ed., Mac-Millan Publishing Company, New York, N.Y. 1977, pages 77–87. A very wide variety of gelatin-hardening agents are also described in numerous patents. Factors relating to the use of gelatin-hardening agents in backing layers are discussed, for example, in U.S. Pat. No. 4,977,065. As described in the '065 patent, most gelatin-hardening agents known to the photographic art react slowly so that a period of days or even weeks may be required before the coating is sufficiently hardened to permit processing. As also described in the '065 patent, gelatin-hardening agents which are rapid-acting at moderate temperatures are also known. Both of these types of gelatin-hardeners are disadvantageous in this invention since slow-acting hardeners require a prolonged incubation period and rapid-acting hardeners exhibit an undesirably short pot-life.

The present invention is based upon the use of a blocked gelatin-hardening agent. Such a compound does not harden gelatin at room temperature, or does so only very slowly, but is rendered active by heating and thereby capable of rapidly hardening gelatin. Use of blocked gelatin-hardening agents provides excellent coating solution "pot life" since the species that rapidly reacts with the gelatin is produced only an high temperature, thus preventing premature crosslinking of the gelatin in the holding tank, delivery lines or coating apparatus. It also avoids the need for an incubation period to achieve a fully hardened backing layer.

Blocked gelatin-hardening agents are well known in the photographic art. A particularly preferred example of such a hardening agent is 2,3-dihydroxy-1,4-dioxane (DHD). The use of this compound in the hardening of gelatin is described, for example, in U.S. Pat. No. 2,870,013. Related 1,4-dioxanes and their use in hardening photographic gelatin layers are described in U.S. Pat. No. 3,819,608. As described in the '608 patent, the 1,4-dioxane hardeners can be prepared by reacting glyoxal with diols such as octanediol, 3-chloro-1,2-propanediol, 3-n-butoxy-1,2propanediol, 2-phenyl-1,2-ethanediol, 3-phenoxy-1,2propanediol, trans-1,2-cyclohexanediol and catechol.

The 1,4-dioxanes act as a gelatin-hardening-agent-precursor that is thermally cleavable to form an active gelatin-hardening agent.

In addition to gelatin, a matting agent, a filter dye and the blocked gelatin-hardening agent, a variety of optional ingredients can be included in the backing layer of this invention. These include wetting agents, sequestering agents, dispersing aids and biocides.

In the practice of this invention, the backing layer is applied over the latex subbing layer using coating methods well known in the art, for example, slot-hopper coating, gravure coating, skim-pan/air knife coating, and the like. A key step in the process is the drying of the backing layer. In particular, the backing layer is heated at a temperature and for a time sufficient to (1) dry the layer, (2) activate the blocked gelatin-hardening agent and thereby harden the layer, (3) heat relax the polyester film and (4) promote adhesion of the backing layer to the latex subbing layer. A suitable means for drying the backing layer is by high-temperature air impingement. Temperatures in the range of from about 100° C. to about 150° C. and times from about 30 seconds to about 10 minutes are typically employed. The drying of the backing layer is carried out without prior solidification of the gelatin by chill-setting, i.e., the gelatin is dried from the sol form. Drying can be carried out in more than one stage if desired. For example, a suitable procedure is to heat at about 120° C. for about one minute to dry the backing layer and then raise the temperature to about 135° C. for about two additional minutes to effect heat-relaxation of the polyester film and ensure that the backing layer has been fully hardened.

To form a photographic element, the polyester film, coated with the backing layer described herein, is coated on its opposite side with one or more radiation-sensitive silver halide emulsion layers. The emulsion layers are comprised of silver halide dispersed in a hydrophilic water-permeable colloid. Suitable hydrophilic colloids include both naturally occurring substances such as gelatin and synthetic polymeric substances such as acrylamide polymers or poly(vinyl pyrrolidone). Other layers, such as interlayers, filter layers and protective overcoat layers can optionally be included. Any of the silver halides employed in photographic elements can be employed, including for example, silver bromides, silver chlorides, silver iodides, silver chlorobromides, silver chloroiodides, silver bromoiodides, and silver chlorobromoiodides.

In the photographic elements of this invention, an antistatic layer can optionally be included between the support and the silver halide emulsion layer. In preparing such an antistatic layer, any of the many different types of electrically-conductive metal-containing particles known to be useful in silver halide imaging elements can be employed. Such metal-containing particles include metal oxides such as $V_2O_5$, $TiO_2$, $SnO_2$, $Al_2O_3$, $ZrO_2$, $In_2O_3$ and ZnO, metal borides such as $TiB_2$, $ZrB_2$, $NbB_2$, $TaB_2$, $CrB_2$, MoB, WB and $LaB_6$, metal nitrides such as ZrN, TiN, and HfN and metal carbides such as TiC, WC, HfC and ZrC. Metal oxides are preferred, with particularly preferred examples including antimony-doped tin oxide, aluminum-doped zinc oxide and niobium-doped titanium oxide. A convenient technique for forming the antistatic layer is to incorporate the electrically-conductive metal-containing particles in the gel sub layer underlying the silver halide emulsion layer.

As hereinbefore disclosed, in the manufacture of the photographic element of this invention a high temperature heating step is employed to activate the blocked gelatin-hardening agent and thereby rapidly harden the backing layer. The manufacturing process of this invention requires that the backing layer be coated and hardened before the silver halide emulsion layer is coated. The reason for this is that the silver halide emulsion layer is not capable of withstanding the high temperature required to rapidly harden the backing layer. By coating the backing layer first, it is, of course, feasible to use high temperature heating to achieve the benefits hereinabove described.

The following tests were carried out to illustrate the importance of using a blocked gelatin-hardening agent in the manufacturing process of this invention in order to obtain a fully hardened backing layer that adequately resists processing solutions.

Aqueous coating compositions containing gelatin and a hardener, as specified below, were coated on a polyethylene terephthalate film having a thickness of 0.1 millimeters and having thereon a 0.1 micrometer thick subbing layer containing an 83/15/2 terpolymer of vinylidene chloride/methyl acrylate/itaconic acid. The aqueous coating compositions contained two weight percent total solids and were dried for 45 seconds at 120° C. (without prior solidification of the gelatin by chill-setting) to give a dry coating weight of 300 mg/m². The temperature was then increased to 133° C. and maintained at that level for 2 minutes. The hardness of the backing layer was tested by soaking the coated film for 30 seconds in each of a developing solution, a fixing solution and distilled water, each maintained at 35° C. The backing layer was then rubbed vigorously with a Neoprene rubber pad and its durability recorded on a scale of 1 to 5 with 1 representing the best performance and 5 the worst. The quality of the coating was also rated.

The hardeners used in the tests were as follows:
(1) 2,3-dihydroxy-1,4-dioxane
(2) chromium potassium sulfate dodecahydrate (3) hexamethoxymethylmelamine (available from American Cyanamid Company under the trademark CYMEL 300).

The results obtained are summarized in Table 1 below.

TABLE 1

| Test No. | Hardener | Concentration of Hardener (weight %) | Hardness Rating | Coating Quality |
|---|---|---|---|---|
| 1 | (1) | 0.2 | 5 | Good |
| 2 | (1) | 0.96 | 3 | Good |
| 3 | (1) | 1.68 | 1 | Good |
| 4 | (1) | 1.9 | 1 | Good |
| 5 | (1) | 4.3 | 1 | Good |
| 6 | (1) | 6.7 | 1 | Good |
| 7* | (1) | 6 | 5 | Good |
| 8 | (2) | 5.25 | 5 | Good |
| 9 | (2) | 12.75 | 5 | Good |
| 10 | (2) | 20.25 | 5 | Good |
| 11 | (3) | 5 | 1 | Poor |
| 12 | (3) | 12 | 1 | Poor |
| 13 | (3) | 20 | 1 | Poor |

*In this test, the step of heating at 133° C. for 2 minutes was omitted.

As indicated by the data in Table 1, use of 2,3-dihydroxy-1,4-dioxane, a preferred hardener for the purposes of this invention, gave both an excellent hardness rating of 1 and good coating quality except in tests 1 and 2 where less than an optimum concentration of hardener was used and in test number 7 where the step of heating at 133° C. for 2 minutes was omitted. Use of chromium potassium sulfate dodecahydrate as a gelatin hardener in tests 8 to 10 gave coatings with a very poor hardness rating. This compound, which is commonly referred to as potassium chrome alum, is very commonly used as a gelatin hardening agent but it is not a blocked hardener. It requires a relatively lengthy period to fully harden a gelatin layer. The compound hexamethoxymethylmelamine, which is also commonly used as a gelatin-hardening agent, gave excellent hardness ratings in tests 11 to 13 but the coatings exhibited a reticulation pattern which is highly undesirable in a photographic element intended for use as an imaging master in the graphic arts. For this reason, the coating quality was rated as poor. Thus, while hexamethoxymethylmelamine is able to harden rapidly at the temperature utilized in the manufacturing process of this invention, it is unable to meet quality requirements. The high temperature dried and heat-relaxed elements of tests 3 to 6 had excellent film quality and transparency and the coatings were durable and non-tacky after exposure to photographic processing solutions.

The above tests illustrate that well known and widely used gelatin hardeners, such as potassium chrome alum and hexamethoxymethylmelamine, are not useful in the manufacturing method of this invention which is based on the use of a high temperature heating step to effect rapid hardening of the backing layer without adversely affecting its physical properties and requires the use of a blocked gelatin-hardening agent which releases an active hardening species as a consequence of such high temperature heating.

The following tests were carried out to illustrate the importance of using gelatin as the binder in the backing layer of this invention in order to achieve good curl control and good receptivity to opaquing inks.

Aqueous coating compositions containing gelatin and 2,3-dihydroxy-1,4-dioxane (DHD), in amounts as specified below, were coated on a polyethylene terephthalate film having a thickness of 0.1 millimeters and having thereon a 0.1 micrometer thick subbing layer containing an 83/15/2 terpolymer of vinylidene chloride/methyl acrylate/itaconic acid. The coatings were dried for 45 seconds at 120° C. and the element was heat-relaxed for 2 minutes at 133° C. For comparison, a similar coating was prepared in which the backing layer contained, in place of gelatin, a hydrophobic acrylic copolymer sold by E. I. dupont de Nemours and Company under the trademark ELVACITE 2041.

The ability of the backing layer to control curl was determined by measuring the curl amplitude which is defined as the difference in the ANSI curl value at 15% and 50% relative humidity. The ANSI curl value is equal to 100/R where R is the radius of curvature in inches of a 4-inch long sample. The larger the number, the greater the degree of curl control.

The opaquing test involved application of a controlled amount of aqueous opaque formulation (KODAK Opaque Red supplied by Eastman Kodak Company) onto the backing layer using a small brush. The opaque was applied at several different coverages and the dry adhesion of the opaque to the backing layer was assessed on a scale of 1 to 5 by scratching the dried opaque with a fingernail. A rating of 1 is the best and of 5 is the worst.

The results obtained are summarized in Table 2 below.

TABLE 2

| Test No. | Backing | Dry Coating Weight (mg/m$^2$) | Wt % DHD | Opaquing Test | Curl Value |
|---|---|---|---|---|---|
| 14 | Gelatin | 200 | 2 | 2 | 2 |
| 15 | Gelatin | 600 | 6 | 2 | 6 |
| 16 | Gelatin | 1000 | 6 | 2 | 9 |
| 17 | Gelatin | 1000 | 2 | 2 | 8 |
| 18 | Gelatin | 1000 | 10 | 2 | 11 |
| 19 | Gelatin | 1000 | 2 | 1 | 7 |
| 20 | Gelatin | 600 | 6 | 1 | 7 |
| 21 | Gelatin | 200 | 6 | 2 | 2 |
| 22 | Gelatin | 200 | 10 | 1 | 4 |
| 23 | Gelatin | 600 | 10 | 2 | 7 |
| 24 | ELVACITE 2041 | 750 | 0 | 5 | 0 |

As shown by the data in Table 2, the backing layers of tests 14 to 23 which contained gelatin and 2,3-dihydroxy-1,4-dioxane provided much better results in both the opaquing test and the curl test than did the backing layer of test 24 which utilized a hydrophobic acrylic copolymer.

The invention is further illustrated by the following examples of its practice.

EXAMPLE 1

A photographic element within the scope of the present invention, designated Element 1, was prepared as indicated below and its performance was compared with photographic elements outside the scope of the present invention designated, respectively, Comparative Elements A, B, C, D and E.

Element 1 was comprised of a 0.1 millimeter thick polyethylene terephthalate film having on each surface thereof a 0.1 micrometer thick subbing layer containing an 83/15/2 terpolymer of vinylidene chloride/methyl acrylate/itaconic acid. On one side, the subbed film was coated, in order, with layers designated below as layers $E_1$, $E_2$ and $E_3$. On the other side, the subbed film was coated, in order, with layers designated below as layers $B_1$ and $B_2$.

$E_1$—This layer had a dry coating weight of 800 mg/m², contained a filter dye and contained gelatin and a butyl acrylate copolymer latex in a ratio of 1:1.

$E_2$—This layer comprised fine grain silver halide particles dispersed in a matrix of gelatin and a butyl acrylate copolymer latex. The ratio of latex to gelatin was 1:1 and the total matrix dry coating weight was 1800 mg/m². Bis(vinyl sulfonyl)methane hardener was incorporated in the layer at a concentration of 1.5 % based on the weight of gelatin. The layer also contained a sensitizing dye to modify the silver halide spectral sensitivity.

$E_3$—This layer had a dry coating weight of 450 mg/m² and contained gelatin, 1.5% by weight of bis(vinylsulfonyl)methane hardener and polymethyl methacrylate beads with an average particle diameter of 4 micrometers at a coverage of 10 mg/m².

$B_1$—This layer contained 400 mg/m² of gelatin, 50 mg/m² of filter dye D3, 13.5 mg/m² of a surfactant, and 3%, based on gelatin weight, of 2,3-dihydroxy-1,4-dioxane. After coating, the layer was dried for about 30 seconds at 120° C. and then immediately coated with layer $B_2$, described below.

$B_2$—This layer contained 400 mg/m² of gelatin, 10 mg/m² of polymethyl methacrylate beads with an average diameter of 4 micrometers, 13.5 mg/m² of a surfactant and 3%, based on gelatin weight, of 2,3-dihydroxy-1,4-dioxane. Drying was carried out for about 30 seconds at 120° C. and thereafter the element was heat-relaxed for about 2 minutes at 133° C.

Comparative Element A was comprised of the same subbed film support coated on one side, in order, with layers designated below as layers $E_1$ and $E_2$ and coated on the other side, in order, with layers designated below as layers $B_1$ and $B_2$.

$E_1$—This layer comprised fine grain silver halide particles dispersed in a matrix of gelatin and a butyl acrylate copolymer latex. The ratio of latex to gelatin was 0.7:1 and the total matrix dry coating weight was 1800 mg/m². Bis(vinyl sulfonyl)methane hardener was incorporated in the layer at a concentration of 1.5% based on the weight of gelatin. The layer also contained a sensitizing dye to modify the silver halide spectral sensitivity.

$E_2$—This layer had a dry coating weight of 450 mg/m² and contained gelatin, 1.5% by weight of bis(vinyl sulfonyl)methane hardener and polymethyl methacrylate beads with an average particle diameter of 4 micrometers at a coverage of 10 mg/m².

$B_1$—This layer contained gelatin, a butyl acrylate copolymer latex, bis(vinyl sulfonyl)methane hardener, and soluble filter dyes. The dry coating weight was 1800 mg/m².

$B_2$—This layer had a dry coating weight of 450 mg/m² and contained gelatin, 1.5% by weight of bis(vinyl sulfonyl)methane hardener and polymethyl methacrylate beads with an average particle diameter of 4 micrometers at a coverage of 10 mg/m².

In the manufacture of Comparative Element A, layers $B_1$ and $B_2$ were simultaneously coated onto the film support by a multi-layer slide hopper coating method, solidified by chill setting the gelatin and dried at a temperature of 50° C.

Comparative Element B was comprised of the same subbed film support coated on one side, in order, with layers designated below as layers $E_1$ and $E_2$ and coated on the other side, in order, with layers designated below as layers $B_1$ and $B_2$.

$E_1$—This layer comprised fine grain silver halide particles and a spectral sensitizing dye dispersed in gelatin and had a dry coating weight of 1800 mg/m². Bis(vinyl sulfonyl)methane hardener was incorporated in the layer at a concentration of 1.5% based on the weight of gelatin.

$E_2$—This layer had a dry coating weight of 450 mg/m² and contained gelatin, 1.5% by weight of bis(vinyl sulfonyl)methane hardener and polymethyl methacrylate beads with an average particle diameter 4 micrometers at a coverage of 10 mg/m².

$B_1$—This layer contained gelatin, bis(vinyl sulfonyl)methane hardener and soluble filter dyes and had a dry coating weight of 1800 mg/m².

$B_2$—This layer had a dry coating weight of 450 mg/m² and contained gelatin, 1.5% by weight of bis(vinyl sulfonyl)methane hardener and polymethyl methacrylate beads with an average particle diameter 4 micrometers at a coverage of 10 mg/m².

Comparative Element C was comprised of the same subbed film support coated on one side, in order, with layers designated below as layers $E_1$, $E_2$ and $E_3$ and coated on the other side with layer $B_1$.

$E_1$—This layer had a dry coating weight of 800 mg/m², contained gelatin, a butyl acrylate copolymer latex and a filter dye and had a ratio of gelatin to latex of 1:1.

$E_2$—This layer comprised fine grain silver halide particles and a spectral sensitizing dye dispersed in a matrix of gelatin and a butyl acrylate copolymer latex. The ratio of latex to gelatin was and the total matrix dry coating weight was 1800 mg/m² Bis(vinyl sulfonyl)methane hardener was incorporated in the layer at a concentration of 1.5% based on the weight of gelatin.

$E_3$—This layer had a dry coating weight of 450 mg/m² and contained gelatin, 1.5% by weight of bis(vinyl sulfonyl)methane hardener and polymethyl methacrylate beads with an average particle diameter of 4 micrometers at a coverage of 10 mg/m².

$B_1$—This layer comprised 750 mg/m² of ELVACITE 2041 acrylic copolymer coated from an organic solvent formulation and dried at 110° C.

Comparative Element D was comprised of the same subbed film support coated on one side, in order, with layers $E_1$, $E_2$ and $E_3$ that were identical to layers $E_1$, $E_2$ and $E_3$ of Comparative Element C and on the opposite side with layer $B_1$ as described below.

$B_1$—This layer contained 200 mg/m² gelatin, 10 mg/m² polymethyl methacrylate beads with an average particle size of 4 micrometers, 50 mg/m² of filter dye D3 and 3% of 2,3-dihydroxy-1,4-dioxane based on gelatin weight. The layer was dried for about 30 seconds at 120° C. and thereafter the element was heat-relaxed for about 2 minutes at 133° C.

Comparative Element E was comprised of the same subbed film support coated on one side, in order, with layers $E_1$ and $E_2$ that were identical to layers $E_1$ and $E_2$ of Comparative Element A and coated on the other side with layer $B_1$ as described below.

$B_1$—This layer had a dry coating weight of 750 mg/m². It was formed by coating the following formulation and drying for 2 minutes at 120° C.

| Component | Wt. % |
|---|---|
| Deionized water | 46.44 |
| Dye D3 (1.92% solids) | 43.68 |
| VERSA TL 3* | 5.00 |

-continued

| Component | Wt. % |
|---|---|
| RHOPLEX WL81 (42% solids)** | 2.20 |
| $H_2SO_4$ (7.1% solution) | 2.10 |
| PFAZ 322*** | 0.64 |
| Polymer matte beads (40% solids) | 0.04 |

*Trademark for sodium styrene sulfonate/maleic anhydride 3:1 copolymer powder from National Starch and Chemical Co.
**Trademark for an acrylic copolymer latex from Rohm & Haas Company
***Trademark for a polyfunctional aziridine from Sybron Chemicals, Inc.

Element 1 is representative of the present invention. Comparative Element A has a conventional backing layer composed of a mixture of gelatin and a latex polymer. Comparative Element B has a backing layer containing gelatin but no latex polymer. Comparative Element C has a backing layer containing a latex polymer but no gelatin. Comparative Element D has a backing layer similar to that of the present invention but containing less than the minimum of 300 mg/m$^2$ of gelatin required in the present invention. Comparative Element E has a backing layer similar to that described in U.S. Pat. No. 5,077,185.

Each of Element 1 and Comparative Elements A to E were tested for opaquing and curl control in the manner hereinabove described. Each of them was also tested for dimensional stability, hardness/tackiness and antihalation performance in accordance with the following procedures.

Dimensional Stability

A film sample is cut to 15 centimeters in length along the longitudinal direction of the cast film support and another 15 centimeter sample is cut across the transverse direction. Each cut sample is introduced into a chamber which has humidity controls and an accurate gauge for measurement of the sample length. The humidity of the chamber is cycled from low to high humidity and back again and the change in length of the film sample is measured. The average of the change in length of the longitudinal and transverse direction samples is computed as a function of humidity and the dimensional stability is rated as poor, fair, good or excellent.

Hardness/Tackiness

A fresh sample of film (less than one day after coating the backing layer) is processed in a conventional film processing machine (processing solutions at 35° C.) that has been deliberately allowed to become dirty with foreign matter typical of a poorly maintained film processor (for example, aged processing solutions, components leached out of photographic films, micro-organisms, etc.). Several replicates of each film sample are processed in random order to prevent the testing order from affecting the results. The samples are rated on the ability to resist picking up foreign matter on the backing layer during film processing. The hardness is evaluated by soaking the film samples in typical film developer solution at 35° C. for 30 seconds and then dragging a weighted stylus across the backing layer and recording the weight at which the stylus scratches the backing. The film is rated as poor, fair, good or excellent.

Antihalation Performance

The ability of the backing layer to perform effectively as an antihalation layer is evaluated by determining how well the layer retains the dye during the typical physical handling of the film that is involved in the imaging process and releases the dye (allows the dye to be bleached) during the film processing step. (The backing layer of Comparative Element C is not compatible with the use of aqueous soluble/bleachable dyes and could not be evaluated in this test. It was given a poor rating for dye bleaching since the hydrophobic methyl methacrylate copolymer comprising the backing is known not to be permeable to film processing solutions.) Films are rated for both dye handling and dye bleaching as poor, fair, good or excellent.

The results obtained in the evaluation of Element 1 and Comparative Elements A to E are summarized in Table 3 below.

TABLE 3

| Photographic Element | Dimensional Stability | Tackiness | Hardness | Opaquing | Curl | Dye Handling | Dye Bleaching |
|---|---|---|---|---|---|---|---|
| 1 | Good | Good | Good | Good | Good | Good | Good |
| A | Fair | Poor | Poor | Good | Good | Good | Good |
| B | Poor | Poor | Poor | Good | Good | Good | Good |
| C | Excellent | Excellent | Excellent | Poor | Poor | — | Poor |
| D | Excellent | Good | Good | Fair | Poor | Fair | Good |
| E | Good | Poor | Poor | Fair | Fair | Poor | Good |

Performance is defined as acceptable if the rating in every test was at least good. On this basis, the comparative examples were all deficient in several aspects of performance. This is summarized in Table 4 which clearly shows that only a backing layer in accordance with the present invention is able to simultaneously provide acceptable performance in all of the designated film attributes which are important in the field of graphic arts.

TABLE 4

| Sample | Acceptable | Unacceptable |
|---|---|---|
| Comparative Element A | Opaquing<br>Curl<br>Dye Handling<br>Dye Bleaching | Dimensional Stability<br>Tackiness<br>Hardness |
| Comparative Element B | Opaquing<br>Curl<br>Dye Handling<br>Dye Bleaching | Dimensional Stability<br>Tackiness<br>Hardness |
| Comparative Element C | Dimensional Stability<br>Tackiness<br>Hardness | Opaquing<br>Curl<br>Dye Bleaching |
| Comparative Element D | Dimensional Stability<br>Tackiness<br>Hardness<br>Dye Bleaching | Curl<br>Opaquing<br>Dye Handling |
| Comparative Element E | Dimensional Stability<br>Dye Bleaching | Tackiness<br>Hardness<br>Dye Handling<br>Opaquing<br>Curl |
| Element 1 | Dimensional Stability<br>Opaquing<br>Curl<br>Tackiness<br>Hardness<br>Dye Handling | |

TABLE 4-continued

| Sample | Acceptable | Unacceptable |
|---|---|---|
| | Dye Bleaching | |

As shown by Table 4, conventional backing layers containing both gelatin and a latex polymer, like those of Comparative Element A, exhibit unacceptable performance in regard to dimensional stability, tackiness and hardness. If the latex polymer is omitted from the backing layer, as in Comparative Element B, the dimensional stability is further degraded. Omitting gelatin from the backing layer, as in Comparative Element C, provides excellent characteristics with regard to dimensional stability, tackiness and hardness but poor performance in regard to opaquing, curl and antihalation performance. An element like that of Comparative Example D, which has an inadequate coverage of gelatin, performs in an unacceptable manner in regard to curl, opaqueing and dye handling. An element like that of Comparative Example E, which relies on the use of a polymer with functionally attached carboxyl groups and a polyfunctional aziridine crosslinking agent, performs in an unacceptable manner in regard to tackiness, hardness, dye handling, opaquing and curl. Only an element within the scope of the present invention, in which the backing layer comprises gelatin in an amount of at least 300 mg/m$^2$, a matting agent, a filter dye and a blocked gelatin-hardening agent, is able to meet the difficult goal of simultaneously providing all of the specified characteristics which facilitate use of the element in the very demanding environment of the graphic arts.

EXAMPLE 2

The subbed polyethylene terephthalate film described in Example 1 was coated on one side with a backing layer composition containing 5.3% solids by weight and thereafter was dried and heat treated for four minutes at 121° C. The backing layer was comprised of gelatin in an amount of 800 mg/m$^2$, polymethyl methacrylate beads with an average particle diameter of 4 micrometers at a coverage of 10 mg/m$^2$, filter dye D3 at a coverage of 50 mg/m$^2$ and 2,3-dihydroxy-1,4-dioxane in an amount of 3% based on the weight of gelatin. The element prepared in this manner is referred to hereinafter as Element 2. A similar element, referred to hereinafter as Element 3, was also prepared in which the only difference was replacement of filter Dye D3 with an equal weight of a solid cyan dye having the formula:

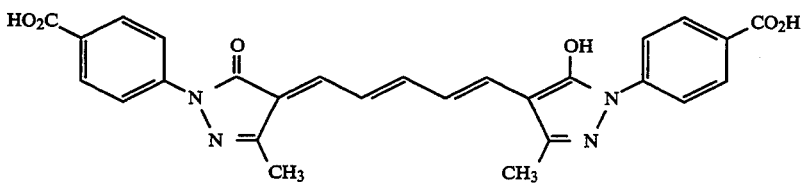

Performance of Elements 2 and 3 with regard to dimensional stability, tackiness, hardness, opaquing, curl, dye handling and dye bleaching was measured in a similar manner to that described hereinabove. Both Element 2 and Element 3 rated good in each of these tests.

The present invention has many advantages over the prior art. It is based on the use of a high temperature heating step to rapidly convert the backing layer to a fully hardened state and thus is dependent on the use of hardeners whose activity is triggered by heating. Conventional gelatin hardeners which act over a period of days or weeks are of no utility in such a manufacturing process. The ability to utilize the high temperatures needed to effectuate such rapid hardening is dependent on carrying out the steps of coating and hardening of the backing layer before the step of coating the silver halide emulsion. The backing layer is relatively thick and includes gelatin, a matting agent and a filter dye to simultaneously meet all of the exacting requirements for an imaging master that is useful in the field of graphic arts. The manufacturing process provides a low cost and highly efficient procedure for providing an effective backing layer without any need for prolonged incubation of the product.

The invention has been described in detail, with particular reference to certain preferred embodiments thereof, but it should be understood that variations and modifications can be effected within the spirit and scope of the invention.

We claim:

1. A method for the manufacture of a photographic element that is useful as a master in the field of graphic arts; said photographic element comprising a dimensionally-stable support having on one side thereof a radiation-sensitive silver halide emulsion layer and on the opposite side thereof a backing layer; said backing layer serving to:
    (1) prevent curl;
    (2) provide halation protection;
    (3) promote effective vacuum contacting in a vacuum drawdown process;
    (4) absorb water-based ink used for correction of image defects; and
    (5) resist aqueous alkaline developing solutions used in processing of said photographic element;
said manufacturing method comprising the steps of:
    (a) providing a dimensionally-stable polyester film having on one side thereof a latex subbing layer;
    (b) forming a backing layer which directly overlies said latex subbing layer, said backing layer comprising:
        (1) gelatin in an amount of at least 300 mg/m$^2$,
        (2) a matting agent,
        (3) a filter dye, and
        (4) a blocked gelatin-hardening agent;
    (c) heating said photographic element at a temperature and for a time sufficient to:
        (1) dry said backing layer;
        (2) activate said blocked gelatin-hardening agent and thereby harden said backing layer;
        (3) heat relax said polyester film; and
        (4) promote adhesion of said backing layer to said latex subbing layer; and (d) applying a radiation-sensitive silver halide emulsion layer to the side of said polyester film opposite said backing layer.

2. A method as claimed in claim 1, wherein said heating is at a temperature of greater than 100° C.

3. A method as claimed in claim 1, wherein said element is heated at a temperature sufficient to dry said backing layer and then the temperature is increased and maintained at the increased level for a time sufficient to heat relax said polyester film.

4. A method as claimed in claim 1, wherein said blocked gelatin-hardening agent is a 1,4-dioxane.

5. A method as claimed in claim 1, wherein said blocked gelatin-hardening agent is 2,3-dihydroxy-1,4-dioxane.

6. A method as claimed in claim 1, wherein the amount of gelatin in said backing layer is in the range of from about 500 to about 1500 mg/m$^2$.

7. A method as claimed in claim 1, wherein said polyester film is a poly(ethylene terephthalate) film.

8. A method as claimed in claim 1, wherein said polyester film is a poly(ethylene naphthalate) film.

9. A method as claimed in claim 1, wherein said latex subbing layer comprises a polymer of vinylidene chloride.

10. A method as claimed in claim 1, wherein said latex subbing layer comprises a terpolymer of vinylidene chloride/methyl acrylate/itaconic acid.

11. A method as claimed in claim 1, wherein said backing layer consists of more than one stratum.

12. A method as claimed in claim 1, wherein the amount of gelatin in said backing layer is in the range of from about 400 to about 3000 mg/m$^2$.

13. A method as claimed in claim 1, wherein said matting agent is an organic matting agent.

14. A method as claimed in claim 1, wherein said matting agent is an inorganic matting agent.

15. A method as claimed in claim 1, wherein said filter dye is a solid particle dispersion filter dye.

16. A method for the manufacture of a photographic element that is useful as a master in the field of graphic arts; said photographic element comprising a dimensionally-stable support having on one side thereof a radiation-sensitive silver halide emulsion layer and on the opposite side thereof a backing layer; said backing layer serving to:
   (1) prevent curl;
   (2) provide halation protection;
   (3) promote effective vacuum contacting in a vacuum drawdown process;
   (4) absorb water-based ink used for correction of image defects; and
   (5) resist aqueous alkaline developing solutions used in processing of said photographic element;
said manufacturing method comprising the steps of:
   (a) providing a dimensionally-stable polyester film having on one side thereof a latex subbing layer;
   (b) forming a backing layer which directly overlies said latex subbing layer, said backing layer comprising:
      (A) a first stratum comprising:
         (1) gelatin in an amount of at least 300 mg/m$^2$;
         (2) a filter dye; and
         (3) a blocked gelatin-hardening agent, and
      (B) a second stratum comprising:
         (1) gelatin in an amount of at least 300 mg/m$^2$;
         (2) a matting agent; and
         (3) a blocked gelatin-hardening agent;
   (c) heating said photographic element at a temperature and for a time sufficient to:
      (1) dry said backing layer;
      (2) activate said blocked gelatin-hardening agent and thereby harden said backing layer;
      (3) heat relax said polyester film; and
      (4) promote adhesion of said backing layer to said latex subbing layer; and
   (d) applying a radiation-sensitive silver halide emulsion layer to the side of said polyester film opposite said backing layer.

* * * * *